(12) United States Patent
Tsuji

(10) Patent No.: US 7,227,877 B2
(45) Date of Patent: Jun. 5, 2007

(54) SEMICONDUCTOR LASER DEVICES

(75) Inventor: Makoto Tsuji, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 10/618,588

(22) Filed: Jul. 15, 2003

(65) Prior Publication Data

US 2004/0013142 A1    Jan. 22, 2004

(30) Foreign Application Priority Data

Jul. 15, 2002    (JP)    ............................ 2002-205743

(51) Int. Cl.
*H01S 3/04*    (2006.01)
(52) U.S. Cl. ....................................... 372/36
(58) Field of Classification Search ............... 372/36, 372/99; 257/99
See application file for complete search history.

(56) References Cited

U.S. PATENT DOCUMENTS 5,309,460 A * 5/1994 Fujimaki et al. .............. 372/36
5,557,116 A * 9/1996 Masui et al. ................. 257/100
2002/0071461 A1* 6/2002 Nishiyama .................... 372/36

FOREIGN PATENT DOCUMENTS

JP    06-350131    12/1994
JP    2001-230482    8/2001

* cited by examiner

*Primary Examiner*—James Menefee
*Assistant Examiner*—Tod T. Van Roy
(74) *Attorney, Agent, or Firm*—Morrison & Foerester LLP

(57) ABSTRACT

There is provided a semiconductor laser device which allows a stem body and a heat radiation block to be integrally fabricated even in small-size packages and which is low in price. Portions of leads 3A, 3B protruding on a reference surface side are placed on one side surface side of the heat radiation block 2 on which the semiconductor laser chip is mounted. Further, a cover 6 made of resin which is opened on the beam-output side of the semiconductor laser chip 4 is fixed to the heat radiation block 2 so as to surround the semiconductor laser chip 4 and the portions of the leads 3A, 3B protruding on the reference-surface side in conjunction with the heat radiation block 2.

5 Claims, 5 Drawing Sheets

SEMICONDUCTOR LASER DEVICES

BACKGROUND OF THE INVENTION

The present invention relates to semiconductor laser devices and, in particular, a semiconductor laser device to be used as a light source for optical disks.

Conventionally, there has been provided a semiconductor laser device as shown in FIG. 6. In this semiconductor laser device, as shown in FIG. 6, two leads 23A, 23B out of three leads are attached so that one end thereof passes through a stem body 21 to protrude on a reference surface 21a side. A remaining one lead 23C is attached on a rear surface side (opposite to the reference surface 21a side) of the stem body 21, where the lead 23C and the reference surface 21a are electrically connected to each other. Also, a heat radiation block 22 is disposed on the reference surface 21a side of the stem body 21. A semiconductor laser chip 24 is mounted on a side face of the heat radiation block 22, and an electrode of the semiconductor laser chip 24 is electrically connected to the lead 23A via an Au (gold) line 25. Then, on the reference surface 21a side of the stem body 21, a cap 26 with a window glass 27 attached is fitted to an annular welding portion A near an outer circumference of the reference surface 21a of the stem body 21 by resistance welding, by which the semiconductor laser chip 24 and the Au line 25 are protected and besides the interior of the cap 26 is maintained hermetic. The outer diameter of the reference surface 21a of the stem body 21 is 5.6 mm, and a margin of the outer circumference of the reference surface 21a with the cap 26 fitted is 0.6 mm. The margin of the reference surface 21a near its outer circumference out of the coverage with the cap 26 serves as a reference plane for alignment position of the laser in incorporating this semiconductor laser device into an optical-disk pickup, and is needed when the semiconductor laser device is adjusted in its rotational position.

With the structure of this semiconductor laser device, there are no problems when the reference surface 21a of the stem body 21 is 5.6 mm in diameter. In small-size packages in which the reference surface of the stem body is 3.3 mm in diameter, there is a problem that the internal area of the cap is too small for the formation of the heat radiation block 22 into such a shape that a margin near the outer circumference serving as a reference plane for the alignment position of a laser is ensured outside the cap when the cap is attached, and moreover that the generated heat of the semiconductor laser chip can be sufficiently dissipated. Therefore, broadening the area of the heat radiation block would cause the heat radiation block to come in contact with the inner circumference of the cap, making it inevitable to extend the depth of the heat radiation block (i.e., to provide a tall heat radiation block). However, with such a small-size package, extending the depth of the heat radiation block would make it difficult to fabricate the stem body and the heat radiation block as an integral pressed article, where only the heat radiation block would inevitably be attached later by means of, for example, silver soldering. For this reason, there is a problem that a semiconductor laser device in which the heat radiation block is later attached to the stem body would be high-priced, compared with integrally pressed articles.

SUMMARY OF THE INVENTION

Accordingly, an object of the present invention is to provide a semiconductor laser device which allows the stem body and the heat radiation block to be integrally fabricated even in small-size packages and which is low in price.

In order to achieve the above object, a semiconductor laser device of the present invention comprises: a stem body having a reference surface; a heat radiation block which is provided on the reference surface of the stem body and which has a semiconductor laser chip mounted on a side face thereof; and a lead which extends through the stem body, wherein a portion of the lead protruding on a reference surface side is placed on one side surface side of the heat radiation block on which the semiconductor laser chip is mounted. Further, a cover is fixed to at least one of the heat radiation block and the stem body so as to surround the semiconductor laser chip and the portions of the leads protruding on the reference-surface side, in conjunction with the heat radiation block. Also, the cover is opened on at least its one side that is a beam-output side of the semiconductor laser chip so that a laser beam outputted from the semiconductor laser chip is not obstructed.

According to this semiconductor laser device, because the cap is not used, it becomes possible to broaden the outer circumference of the heat radiation block to the margin of the outer circumference of the stem body serving as the reference plane for alignment position of the laser except the side face (surrounded by the cover) of the heat radiation block on which the semiconductor laser chip is mounted, thus providing an advantage for size reduction. Also, the semiconductor laser chip as well as the wire (Au line etc.) for connecting its electrode and the leads to each other are protected by the cover fixed to at least one of the heat radiation block and the stem body. Furthermore, it has been verified by humidity tests or the like that recent semiconductor laser chips are no problem even if not maintained hermetic. When such a semiconductor laser chip requiring no hermeticity is adopted in the semiconductor laser device of the invention, the semiconductor laser chip as well as the wire for connecting its electrode and the leads to each other can be protected by the cover without a cap, and moreover a heat radiation block having enough size to radiate the heat of the semiconductor laser chip can be formed without broadening the depth of the heat radiation block even in small-size packages. Thus, there can be implemented a low-priced semiconductor laser device which allows the stem body and the heat radiation block to be fabricated as an integral pressed article even in small-size packages.

Further, in the semiconductor laser device of one embodiment, the cover is made of an insulative resin material. In this case, it becomes simpler and lower in cost to form the cover into a particular shape such as a generally semicylindrical shape. Moreover, even if the lead or the wire (Au line etc.) comes in contact with the cover, they, which are electrically insulated by the cover, are free from the possibility of short-circuiting.

In one embodiment, a depth of the cover in the beam-output direction of the semiconductor laser chip is substantially equal to a depth of the heat radiation block. Thus, enough protection of the semiconductor laser chip as well as the wire for connecting the electrode of the chip and the leads to each other can be achieved by this cover.

In one embodiment, the cover has a recessed portion for putting therein a resin for bonding the cover to the heat radiation block. Thus, the cover can reliably be adhesively bonded without incurring vicinal overflow of the adhesive.

In one embodiment, the heat radiation block has a recessed portion for putting therein a resin for bonding the cover to the heat radiation block. Thus, the cover can reliably be adhesively bonded without incurring vicinal overflow of the adhesive.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Hereinbelow, the semiconductor laser device of the present invention is described in detail by way of embodiments thereof illustrated in the accompanying drawings.

The First Embodiment

Figure 1:
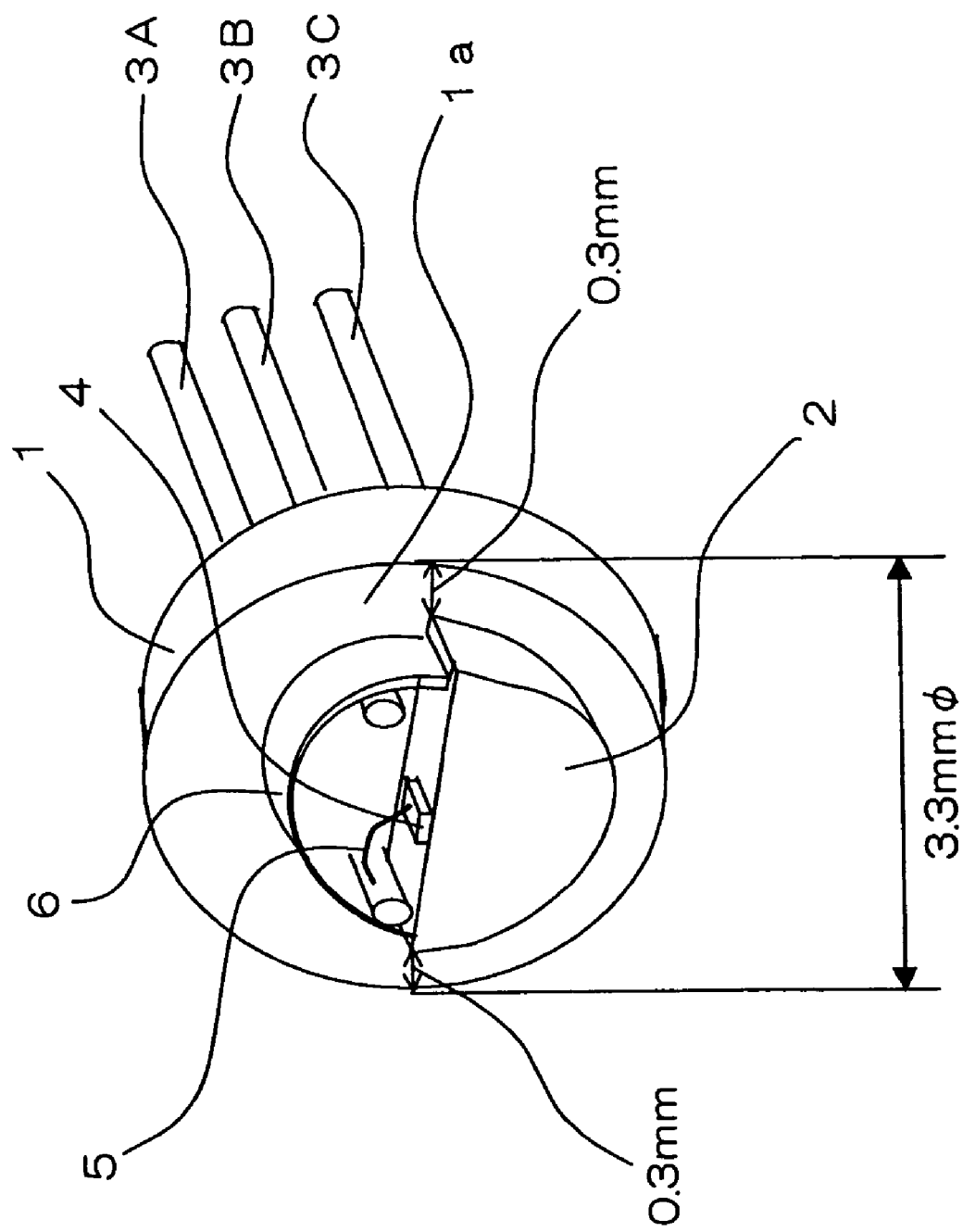
FIG. 1 is a perspective view showing a whole semiconductor laser device according to a first embodiment of the present invention.

FIG. 1 is a perspective view showing a whole semiconductor laser device according to a first embodiment of the invention. In FIG. 1, there are shown, with reference numerals attached as follows, a generally disk-shaped stem body 1, a generally semicircular-plate-shaped heat radiation block 2 provided on a reference surface 1a of the stem body 1, leads 3A, 3B extending through the stem body 1, a lead 3C whose one end is electrically connected to a rear surface side (opposite to the reference surface 1a side) of the stem body 1, a semiconductor laser chip 4 mounted on one side face of the heat radiation block 2, an Au (gold) line 5 for electrically connecting an electrode of the semiconductor laser chip 4 and the reference surface 1a side of the lead 3A to each other, and an arch-shaped, i.e., generally semicylindrical cover 6. The beam-output direction of the semiconductor laser chip 4 is a direction parallel to the axis of the stem body 1 and opposite to a direction toward the reference surface 1a. The two leads 3A, 3B have one end extending through the stem body 1 so as to protrude on the reference surface 1a side, where the portions of the leads 3A, 3B protruding on the reference surface 1a side are placed on one surface side of the heat radiation block 2 on which the semiconductor laser chip 4 is mounted. Also, the leads 3A, 3B are electrically insulated from the stem body 1.

In the semiconductor laser device shown in FIG. 1, the outer diameter of the reference surface 1a of the stem body 1 is 3.3 mm, and a margin of the outer circumference side of the stem body 1 serving as a reference plane for alignment position of the laser is 0.3 mm.

A cylindrical surface of the heat radiation block 2, other than the surface on which the semiconductor laser device is to be mounted, is broadened to the margin of the outer circumference of the stem body 1 because the cap is not used. Also, the cover 6 for protection of the semiconductor laser chip 4 and the Au line 5 is attached to at least one of the heat radiation block 2 and the stem body 1 in such a fashion that the semiconductor laser chip 4, the Au line 5 and the protruding portions (on the reference surface 1a side) of the two leads 3A, 3B are surrounded by the cover 6 together with the heat radiation block 2, and that the cover 6 is opened on its one side that is the beam-output side of the semiconductor laser chip 4.

Figure 2:
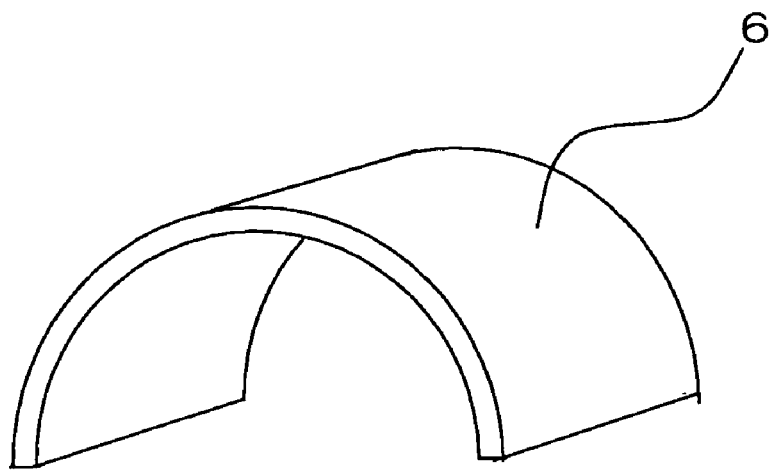
FIG. 2 is a perspective view of a cover of the semiconductor laser device.

FIG. 2 shows a perspective view of the cover 6 of the semiconductor laser device. This cover 6 has an arch shape resulting from cutting a cylinder into generally one half by a plane parallel to its axis, i.e., has a generally semicylindrical shape.

With the semiconductor laser device of the above constitution, because the cap is not used, it becomes possible to broaden the margin of the outer circumference of the stem body 1 that serves as the reference plane for alignment position of the laser, and moreover the semiconductor laser chip 4 and the Au line 5 are protected by the cover 6 fixed to at least one of the heat radiation block 2 and the stem body 1. This semiconductor laser device is free from problems even if not maintained hermetic, and even in the case of a 3.3 mm dia. small-size package, capable of protecting the semiconductor laser chip 4 and the Au line 5 without a cap, and yet capable of sufficiently radiating the heat generated by the semiconductor laser chip 4 by means of the heat radiation block 2 without broadening the depth of the heat radiation block 2. Thus, there can be implemented a low-priced semiconductor laser device which is capable of protecting the semiconductor laser chip and the Au line without using a cap and also capable of fabricating the stem body 1 and the heat radiation block 2 as an integral pressed article even in a small-size package.

Further, since using resin as the material of the cover 6 makes it simpler to form its semicylindrical shape, the cover 6 can be fabricated with low cost. Even if the Au line 5 is in contact with the cover 6, the cover 6, which is of electrical insulation, can prevent the Au line 5 from short-circuiting with the other portions.

Furthermore, the depth of the cover 6 in the beam-output direction of the semiconductor laser chip 4 (i.e., the length of the cover 6 from the reference surface of the stem body 1 in the beam-output direction) has only to be generally equal to the depth of the heat radiation block 2. Thus, while the small-size shape is maintained, the semiconductor laser chip 4 and the Au line 5 can reliably be protected.

The Second Embodiment

Figure 3:
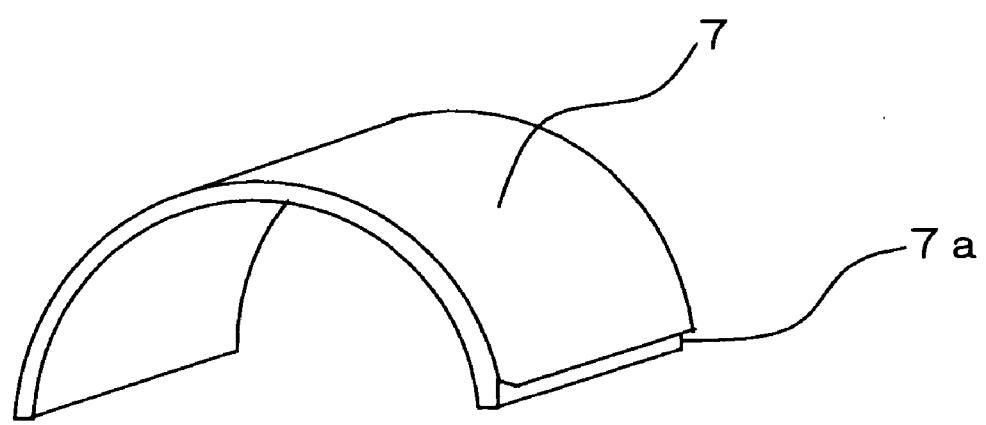
FIG. 3 is a perspective view of a cover of a semiconductor laser device according to a second embodiment of the invention.

FIG. 3 shows a perspective view of a cover to be used for a semiconductor laser device according to a second embodiment of the invention. It is noted that the semiconductor laser device of this second embodiment is identical in constitution to the semiconductor laser device of the first embodiment shown in FIG. 1 except the cover, and so FIG. 1 is referred to also in this case.

As shown in FIG. 3, a cover 7 has an arch shape resulting from cutting a cylinder into generally one half by a plane parallel to its axis, and a recessed portion 7a is provided at each of both end portions of the cover 7 where the cover 7 is in contact with the heat radiation block 2 (only one end is shown in FIG. 3). In bonding this cover 7 to the heat radiation block 2 of the stem body 1, an adhesive such as UV (ultraviolet)-curing resin is put into the recessed portions 7a of the cover 7 to achieve the bonding.

In this semiconductor laser device of the second embodiment, while the same effects as those of the semiconductor laser device of the first embodiment are produced, the cover 7 can reliably be adhesively bonded without incurring vicinal overflow of the adhesive by virtue of the arrangement that the recessed portions 7a into which the resin for adhesively bonding the cover 7 to the heat radiation block 2 is to be put are provided at each of both ends (contact portions with the heat radiation block 2) of the arch-shaped cover 7.

The Third Embodiment

Figure 4:
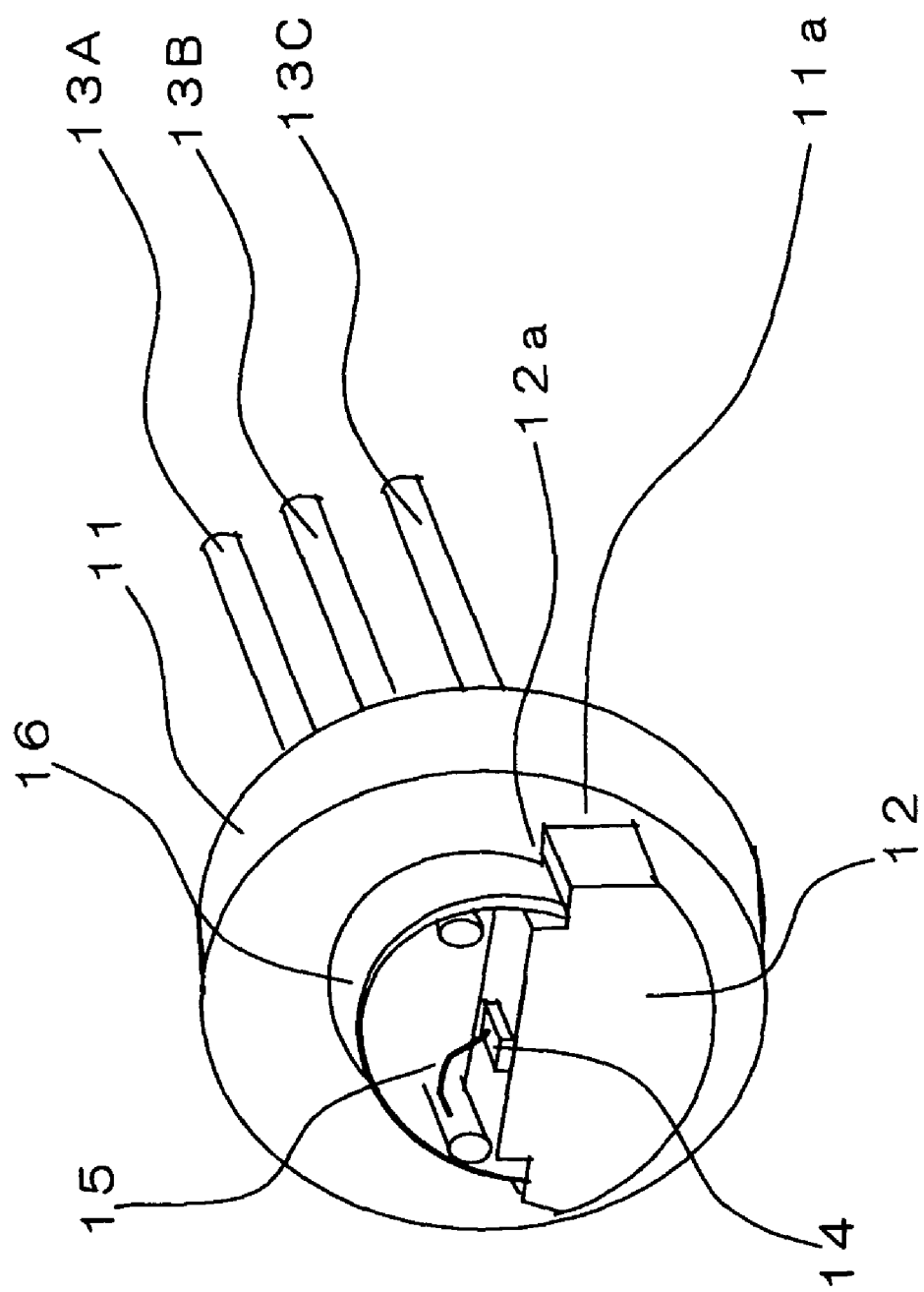
FIG. 4 is a perspective view showing a whole semiconductor laser device according to a third embodiment of the invention.

FIG. 4 is a perspective view showing a whole semiconductor laser device according to a third embodiment of the invention.

In FIG. 4, there are shown a generally diskshaped stem body 11, a heat radiation block 12 provided on a reference surface 11a of the stem body 11, leads 13A, 13B extending through the stem body 11, a lead 13C whose one end is electrically connected to a rear surface side (opposite to the reference surface 11a side) of the stem body 11, a semiconductor laser chip 14 mounted on the heat radiation block 12, an Au line 15 for electrically connecting an electrode of the semiconductor laser chip 14 and the reference surface 11a side of the lead 13A to each other, and a cover 16 having an arch shape resulting from cutting a cylinder into generally one half by a plane parallel to its axis. The beam-output direction of the semiconductor laser chip 14 is a direction parallel to the axis of the generally disk-shaped stem body 11 and opposite to a direction toward the reference surface 11a. The two leads 13A, 13B have one end extending through the stem body 11 so as to protrude on the reference surface 11a side, where the portions of the leads 13A, 13B protruding on the reference surface 11a side are placed on one surface side of the heat radiation block 12 on which the semiconductor laser chip 14 is mounted. Also, the leads 13A, 13B are electrically insulated from the stem body 11.

As shown in FIG. 4, a recessed portion 12a is provided at each of portions of the heat radiation block 12 where the heat radiation block 12 is in contact with both ends of the cover 16. In bonding the cover 16 to the heat radiation block 12, an adhesive is put into the recessed portions 12a of the heat radiation block 12 to achieve the bonding, as in the second embodiment.

In this semiconductor laser device of the third embodiment, while the same effects as those of the semiconductor laser device of the first embodiment are produced, the cover 16 can reliably be adhesively bonded without incurring vicinal overflow of the adhesive by virtue of the arrangement that the recessed portions 12a into which the resin for adhesively bonding the cover 16 to the heat radiation block 12 is to be put are provided in the heat radiation block 12 (its contact portions with which the arch-shaped cover 16 comes in contact).

The Fourth Embodiment

Figure 5:
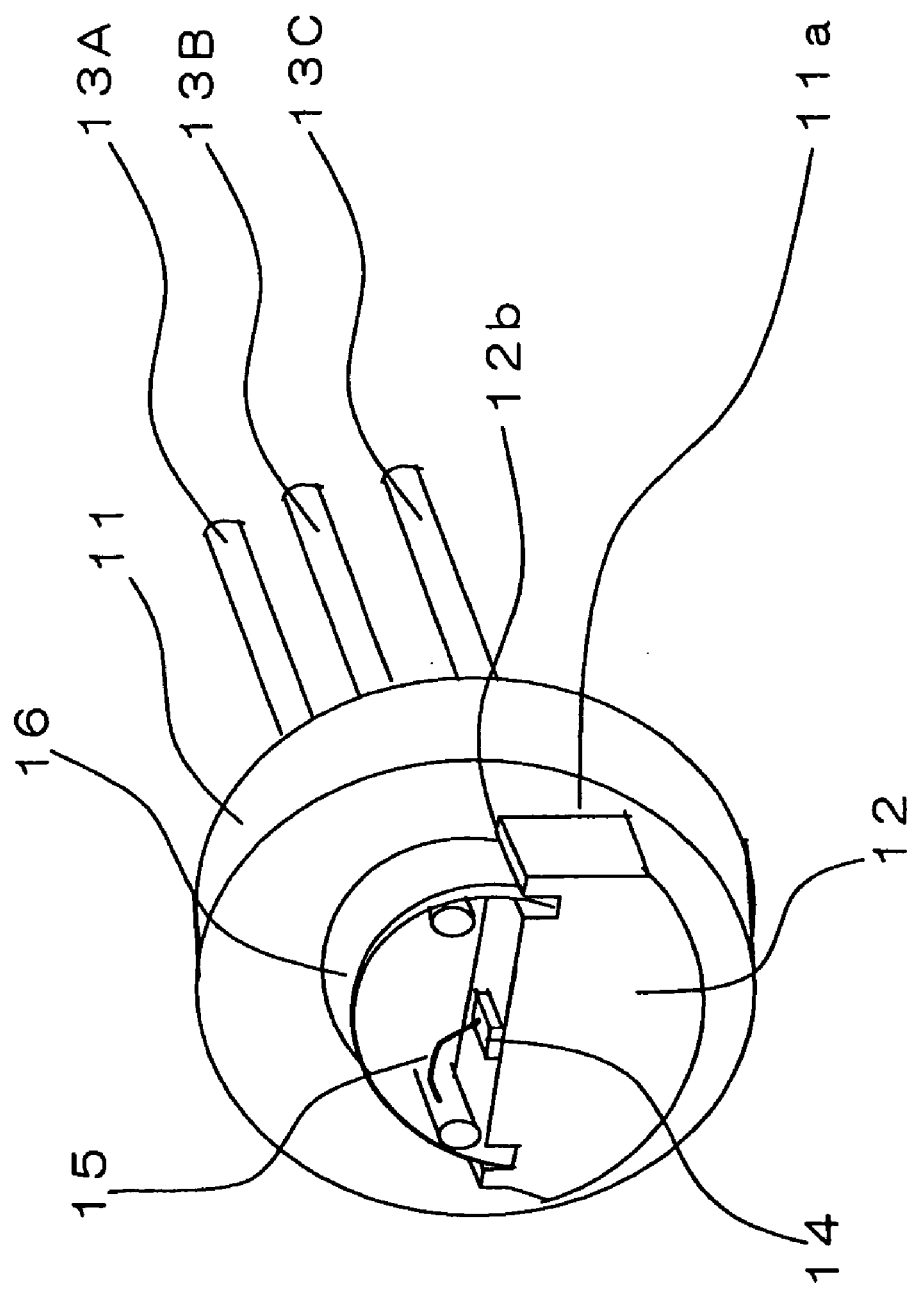
FIG. 5 is a perspective view showing a whole semiconductor laser device according to a fourth embodiment of the invention.
Figure 6:
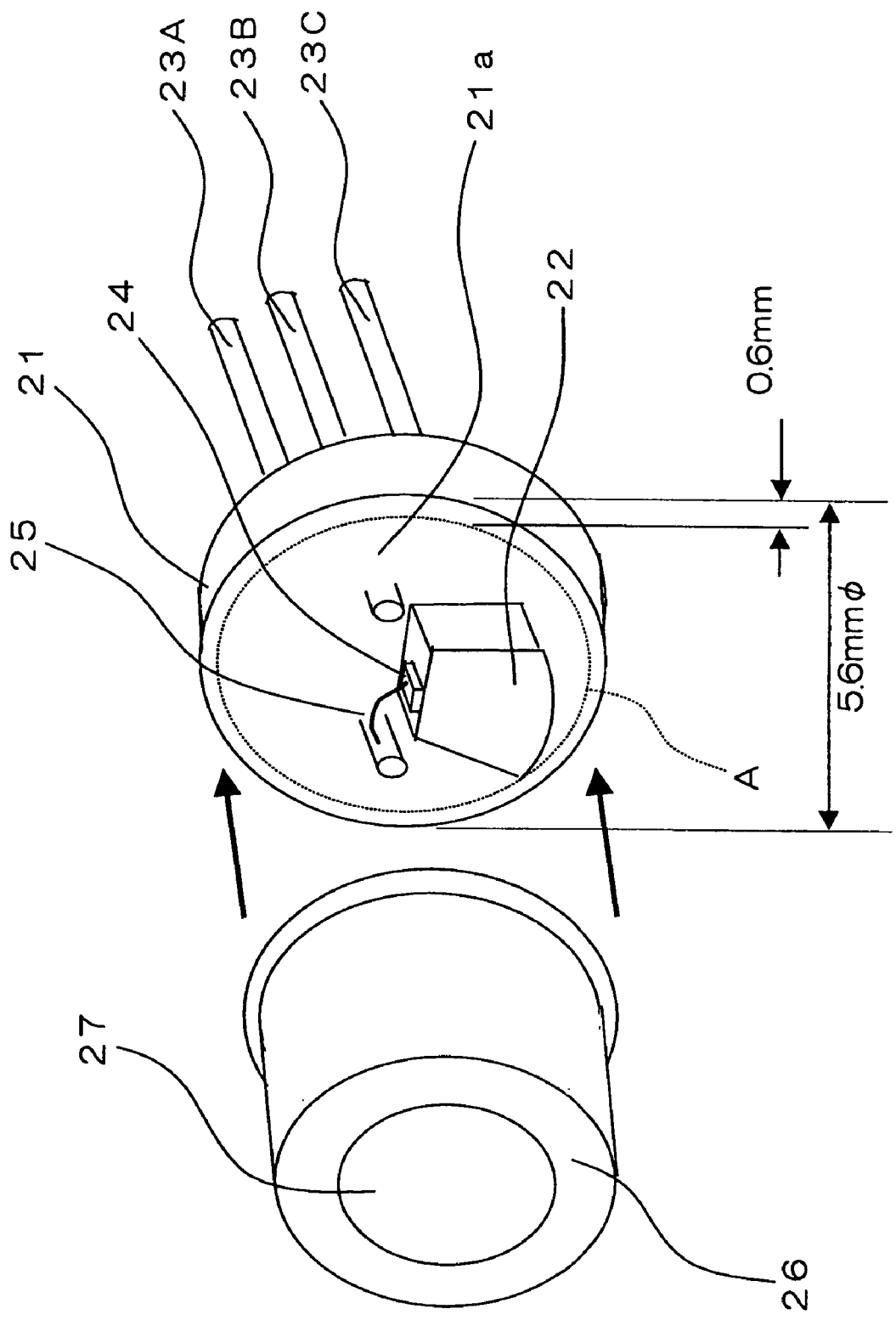
FIG. 6 is a perspective view showing a whole semiconductor laser device according to a prior art.

FIG. 5 is a perspective view showing a whole semiconductor laser device according to a fourth embodiment of the invention. In this case, the shape of the heat radiation block is changed from that of FIG. 4, thereby making it possible to fix the cover 16 to the heat radiation block 12 by means of fitting using a fitting portion 12b of the heat radiation block 12 without using any adhesive.

Although an Au line is used as a wire in the first to fourth embodiment, other metal materials such as Al may also be used as the wire.

In the second embodiment, an adhesive is put into the recessed portions 7a provided in the cover 7, allowing the cover 7 to be bonded to the heat radiation block 2. In the third embodiment, an adhesive is put into the recessed portions 12a provided in the heat radiation block 12, allowing the cover 7 to be bonded to the heat radiation block 2. However, it is also possible to provide recessed portions in both the cover and the heat radiation block, and to put an adhesive into both recessed portions for bonding of the cover and the heat radiation block.

Also, the first to fourth embodiments have been described on a semiconductor laser device using three leads. However, without being limited to this, the present invention may also be applied to a semiconductor laser device using two or four or more leads.

As apparent from the foregoing description, according to the semiconductor laser device of the present invention, the portions of the leads protruding on the reference surface side are placed on one side surface side of the heat radiation block on which the semiconductor laser chip is mounted, and the cover is fixed to at least one of the heat radiation block and the stem body so as to surround the semiconductor laser chip and the portions of the leads protruding on the reference-surface side, in conjunction with the heat radiation block. Thus, there can be implemented a low-priced semiconductor laser device which is capable of protecting the semiconductor laser chip and the wire by the cover without using a cap and which makes it possible to fabricate, integrally with the stem body, the heat radiation block that can sufficiently radiate the heat of the semiconductor laser chip, even in small-size packages.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a stem body having a reference surface; a heat radiation block which is provided on the reference surface of the stem body and which has a semiconductor laser chip mounted on a side face thereof; and a lead which extends through the stem body, wherein
   a portion of the lead protruding on a reference surface side is placed on one side surface side of the heat radiation block on which the semiconductor laser chip is mounted, and
   the semiconductor laser device further comprises a cover which is attached to the side face of the heat radiation block at both ends thereof so as to surround the semiconductor laser chip and the portion of the lead protruding on the reference-surface side, in conjunction with the side face of the heat radiation block, and which is opened on at-least one side of the cover that is a beam-output side of the semiconductor laser chip, wherein the cover is only a semi-cylinder which does not extend beyond the heat radiation block.

2. The semiconductor laser device according to claim 1, wherein the cover is made of a resin material.

3. The semiconductor laser device according to claim 1, wherein a depth of the cover in the beam-output direction of the semiconductor laser chip is substantially equal to a depth of the heat radiation block.

4. The semiconductor laser device according to claim 1, wherein the cover has a recessed portion for putting therein a resin for bonding the cover to the heat radiation block.

5. The semiconductor laser device according to claim 1, wherein the heat radiation block has a recessed portion for putting therein a resin for bonding the cover to the heat radiation block.

* * * * *